(12) United States Patent
Suzuki et al.

(10) Patent No.: US 9,281,473 B1
(45) Date of Patent: Mar. 8, 2016

(54) MEMORY DEVICE

(71) Applicant: Kabushiki Kaisha Toshiba, Minato-ku (JP)

(72) Inventors: Kunifumi Suzuki, Yokkaichi (JP); Kazuhiko Yamamoto, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/795,533

(22) Filed: Jul. 9, 2015

Related U.S. Application Data

(60) Provisional application No. 62/132,844, filed on Mar. 13, 2015.

(51) Int. Cl.
*H01L 45/00* (2006.01)
*H01L 27/24* (2006.01)
*G11C 13/00* (2006.01)

(52) U.S. Cl.
CPC ............ *H01L 45/06* (2013.01); *G11C 13/0004* (2013.01); *H01L 27/2463* (2013.01); *H01L 45/1233* (2013.01); *H01L 45/1253* (2013.01); *H01L 45/144* (2013.01)

(58) Field of Classification Search
CPC ......... H01L 45/04; H01L 45/06; H01L 45/08; H01L 45/144
USPC ......................................... 257/2–5
See application file for complete search history.

(56) References Cited

U.S. PATENT DOCUMENTS

| 8,134,139 B2 * | 3/2012 | Lin ................. H01L 45/144 257/2 |
| 8,222,627 B2 * | 7/2012 | Kuo ................. H01L 45/06 257/3 |
| 2011/0315942 A1 | 12/2011 | Tominaga et al. |
| 2013/0181182 A1 * | 7/2013 | Perniola ............ G11C 13/0004 257/4 |
| 2014/0151622 A1 | 6/2014 | Oyanagi et al. |
| 2014/0252304 A1 | 9/2014 | Soeya et al. |

* cited by examiner

*Primary Examiner* — Cuong Q Nguyen
(74) *Attorney, Agent, or Firm* — Oblon, McClelland, Maier & Neustadt, L.L.P.

(57) ABSTRACT

According to one embodiment, a memory device includes a resistance change film, a selection element connected with the resistance change film in series, and an electrode connected with at least one of the resistance change film and the selection element. The selection element contains a chalcogenide compound, the chalcogenide compound containing silicon.

18 Claims, 11 Drawing Sheets

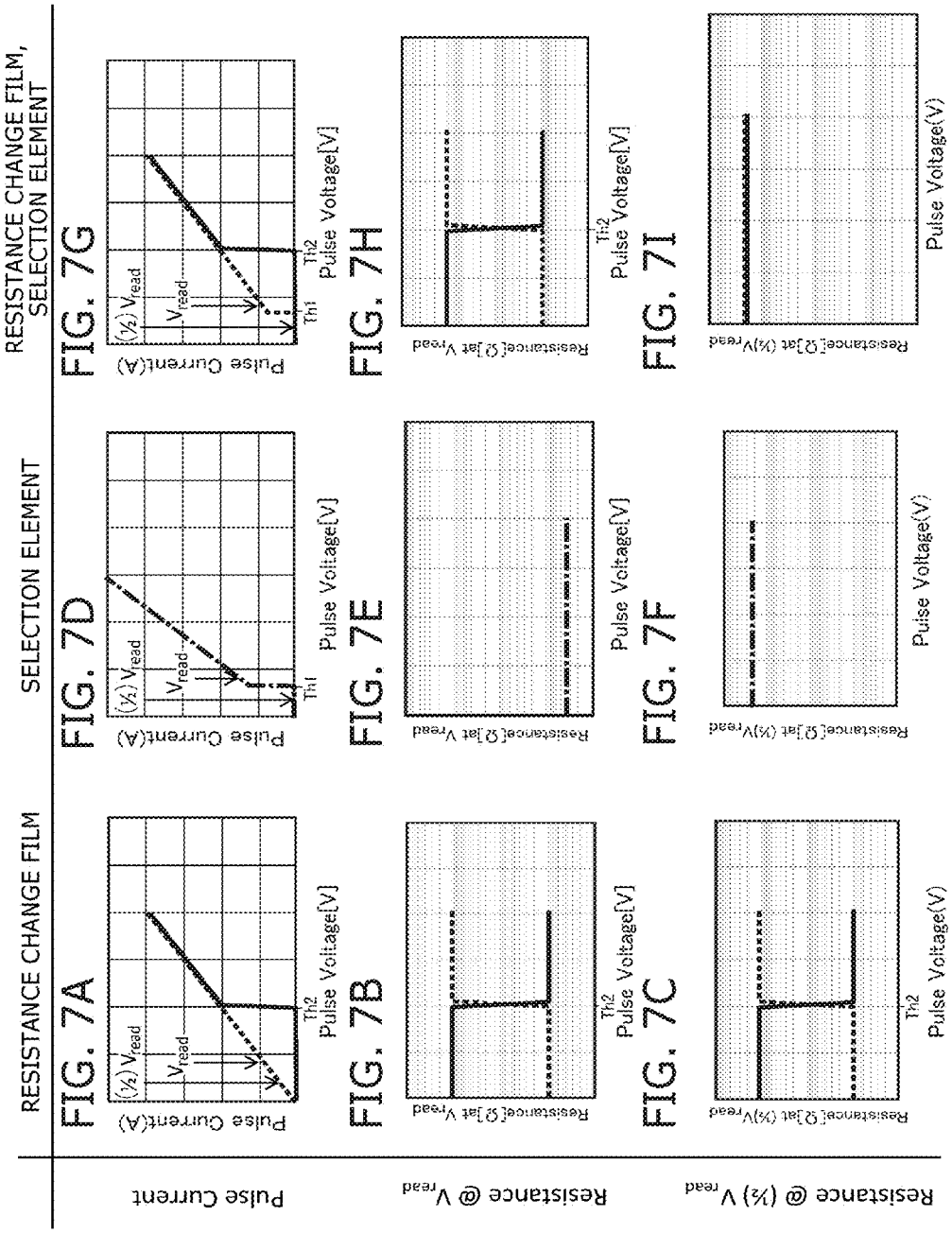

MEMORY DEVICE

CROSS-REFERENCE TO RELATED APPLICATIONS

This application is based upon and claims the benefit of priority from U.S. Provisional Patent Application 62/132,844, filed on Mar. 13, 2015; the entire contents of which are incorporated herein by reference.

FIELD

Embodiments described herein relate to a memory device.

BACKGROUND

In recent years, a material for forming a superlattice structure has attracted attention as a material of a phase-change film of a phase-change random access memory device. The phase-change film having a superlattice structure can exhibit resistance changing characteristics depending on a slight difference in atomic arrangement. In an iPCM (interfacial Phase Change Memory) using such a phase-change film, improvement of reading stability has been demanded.

BRIEF DESCRIPTION OF THE DRAWINGS

FIGS. 7A, 7D, and 7G are graphs illustrating a relationship between a voltage value and a current value when a pulse voltage is applied; FIGS. 7B, 7E, and 7H are graphs illustrating a relationship between a pulse voltage value and a resistance value when a read voltage is applied after a pulse voltage is applied; and FIGS. 7C, 7F, and 7I are graphs illustrating a relationship between a pulse voltage value and a resistance when a voltage corresponding to one half of a read voltage (a half select voltage) is applied after a pulse voltage is applied;

DETAILED DESCRIPTION

In general, according to one embodiment, a memory device includes a resistance change film, a selection element connected with the resistance change film in series, and an electrode connected with at least one of the resistance change film and the selection element. The selection element contains a chalcogenide compound, the chalcogenide compound containing silicon.

First Embodiment

First, a first embodiment will be described.

Figure 1:
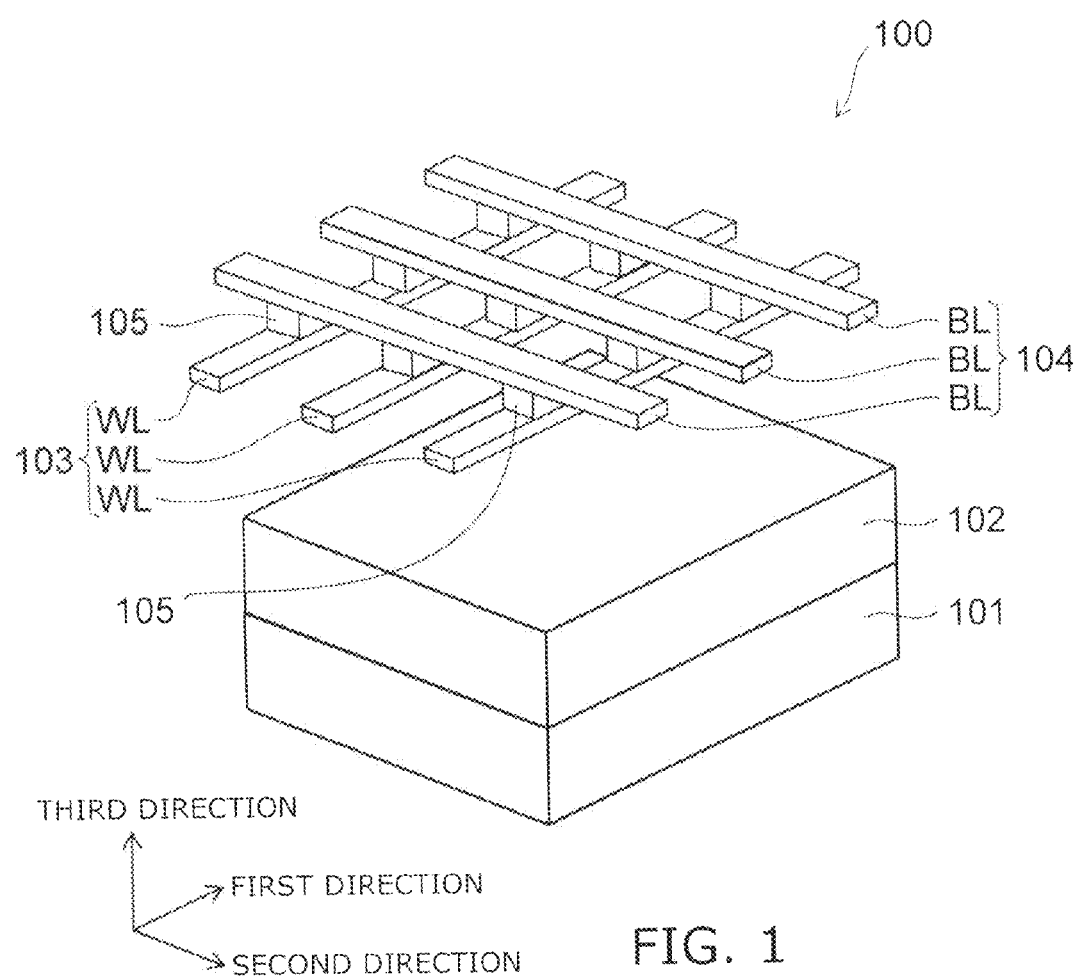
FIG. 1 is a perspective view illustrating a memory device according to a first embodiment.

FIG. 1 is a perspective view illustrating a memory device according to the embodiment.

Figure 2:
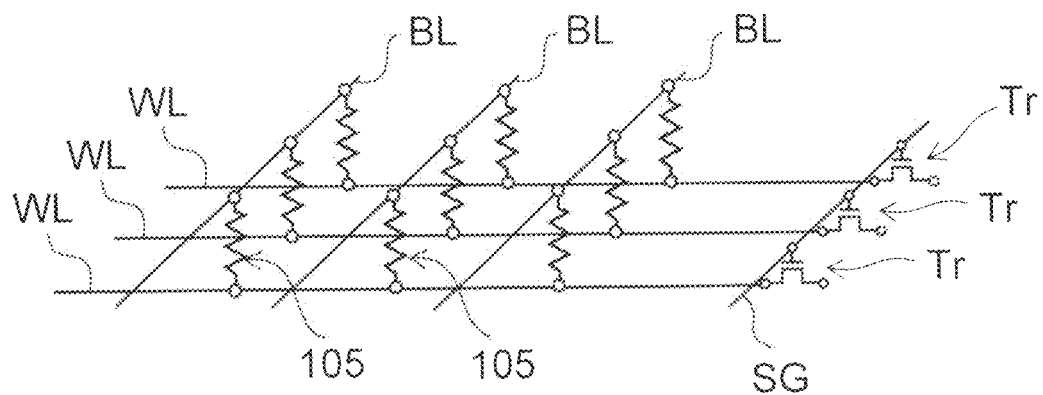
FIG. 2 is a circuit diagram of the memory device according to the first embodiment.

FIG. 2 is a circuit diagram of the memory device according to the embodiment.

As shown in FIG. 1, a memory device 100 according to the embodiment is provided with a semiconductor substrate 101.

Hereinafter, for convenience of explanation, directions parallel to an upper surface of the semiconductor substrate 101 and mutually intersecting each other are defined as "first direction" and "second direction", and a direction perpendicular to the upper surface of the semiconductor substrate 101 is defined as "third direction".

On the semiconductor substrate 101, an interlayer insulating film 102 is provided.

On the interlayer insulating film 102, a stacked body in which a word line wiring layer 103 including multiple word lines WL extending in the first direction and a bit line wiring layer 104 including multiple bit lines BL extending in the second direction are stacked on each other in the third direction is provided. The word lines WL and the bit lines BL are not in contact with one another. The word line WL and the bit line BL are formed from, for example, a metal such as copper (Cu), aluminum (Al), or tungsten (W).

At a closest point between each of the word lines WL and each of the bit lines BL, a memory cell 105 is provided. In this manner, the memory device 100 is a cross-point memory device in which the memory cell 105 is disposed at each closest point between the word line WL and the bit line BL. Further, as shown in FIG. 2, each of the word lines is connected to a transistor Tr whose gate is connected to a selection gate line SG. Incidentally, although illustration is omitted in FIG. 1 for simplification of the drawing, regions between the word lines WL, the bit lines BL, and the memory cells 105 are embedded in insulating films 113 and 114. A description of the insulating films 113 and 114 will be made below. Further, the memory cell 105 includes a resistance change film and a selection element connected in series to the resistance change film, which will be described later. However, in FIG. 2, for simplification of the drawing, the memory cell 105 is shown as one resistance element.

Next, the memory cell 105 will be described.

Figure 3:
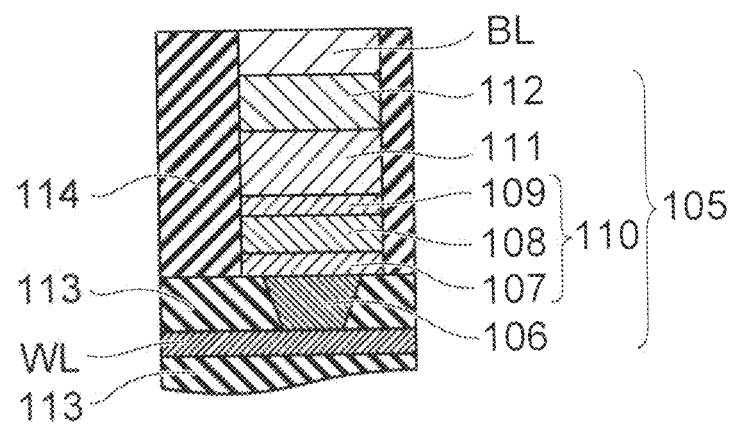
FIG. 3 is a cross-sectional view illustrating a memory cell of the memory device according to the first embodiment.

FIG. 3 is a cross-sectional view illustrating the memory cell 105 of the memory device according to the embodiment.

As shown in FIG. 3, the memory cell 105 is composed of an electrode 106 on the word line WL, a selection element 110 on the electrode 106, a resistance change film 111 on the selection element 110, and an electrode 112 on the resistance change film 111. The electrode 106, the selection element 110, the resistance change film 111, and the electrode 112 are connected in series to one another. Further, the electrode 112 is connected to the bit line BL. The word line WL and the electrode 106 are embedded in the insulating film 113, and the selection element 110, the resistance change film 111, the electrode 112, and the bit line BL are embedded in the insulating film 114. The electrode 106 and the electrode 112 are formed from, for example, a conductive material such as titanium nitride (TiN), tungsten, copper, or aluminum.

The selection element 110 includes an antimony-tellurium layer 107, a silicon-containing chalcogenide compound layer 108, and an antimony-tellurium layer 109, which are stacked in this order on the electrode 106. Instead of the antimony-tellurium layers 107 and 109 bismuth-tellurium layers may be provided. The silicon-containing chalcogenide compound layer 108 contains, for example, silicon-tellurium. The silicon-containing chalcogenide compound layer 108 preferably has a composition in which silicon is contained in an amount of more than 0% and 40% or less. Further, the silicon-containing chalcogenide compound layer 108 preferably has a composition in which tellurium is contained in an amount of 60% or more and less than 100%. Alternatively, the silicon-containing chalcogenide compound layer 108 may contain silicon-selenium or silicon-sulfur. The silicon-containing chalcogenide compound layer 108 is preferably crystalline. The silicon-containing chalcogenide compound layer 108 preferably has a film thickness of, for example, 1 nm or more and 10 nm or less.

Incidentally, an example in which the selection element 110 is configured to have a three-layer structure is shown in FIG. 3, however, the selection element 110 may be configured to have a single layer of the silicon-containing chalcogenide compound layer 108. Further, a two-layer structure such as a stacked structure of (an antimony-tellurium layer 107/a silicon-containing chalcogenide compound layer 108) or a stacked structure of (a silicon-containing chalcogenide compound layer 108/an antimony-tellurium layer 109) may be adopted. In addition, the selection element 110 may be configured to have a structure of four or more layers including the silicon-containing chalcogenide compound layer 108.

The resistance change film 111 includes, for example, a superlattice structure. The resistance change film 111 contains, for example, a chalcogenide compound. The chalcogenide compound layer preferably contains germanium, antimony, or bismuth. For example, the resistance change film 111 is composed of a stacked film in which a film containing germanium and tellurium and a film containing antimony and tellurium are stacked on each other, or a stacked film in which a film containing germanium and tellurium and a film containing bismuth and tellurium are stacked on each other. Incidentally, the resistance change film 111 may be a film containing a metal oxide whose resistance value is changed by an external effect such as heating.

Incidentally, the superlattice is a crystal lattice having a periodic structure longer than that of a basic unit lattice by superimposing multiple types of crystal lattices, and the "superlattice structure" means a structure of such a crystal lattice. The presence or absence of the superlattice structure is confirmed by, for example, X-ray diffraction, electron diffraction, or the like.

The selection element 110 and the resistance change film 111 both preferably contain antimony or bismuth from the viewpoint of stabilization of the structure. The selection element 110 and the resistance change film 111 both preferably contain the same chalcogenide element (for example, tellurium) from the viewpoint of stabilization of the structure. Further, the chalcogenide element is preferably distributed over the selection element 110 and the resistance change film 111 in the film thickness direction. The selection element 110 and the resistance change film 111 preferably include a layer containing antimony or a layer containing bismuth every other layer.

The insulating film 113 and the insulating film 114 may be formed from different materials. For example, the insulating film 113 may be formed from an insulating material having a high heat radiation property such as aluminum nitride.

Next, an operation of the selection element 110 of the memory cell 105 in the embodiment will be described.

Figure 4A:
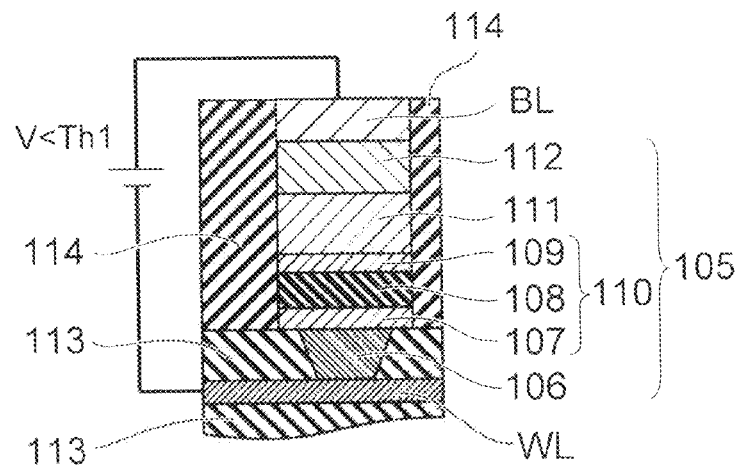
FIGS. 4A to 4C are schematic cross-sectional views illustrating an operation of a selection element of the memory device according to the first embodiment.
Figure 4B:
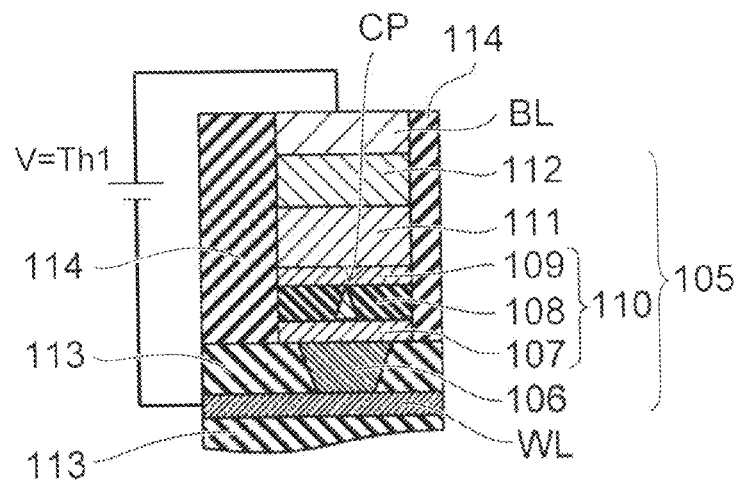
Figure 4C:
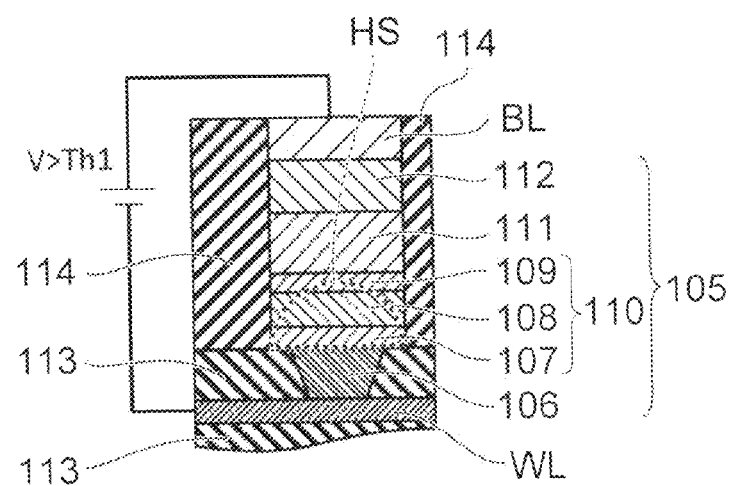

FIGS. 4A to 4C are schematic views illustrating the operation of the selection element of the memory device according to the embodiment.

FIG. 4A is a schematic view in the case where a voltage lower than a threshold Th1 is applied to the memory cell 105, FIG. 4B is a schematic view in the case where a voltage of the threshold Th1 is applied to the memory cell 105, and FIG. 4C is a schematic view in the case where a voltage higher than the threshold Th1 is applied to the memory cell 105.

As shown in FIG. 4A, in the case where a voltage lower than the threshold Th1 is applied to the memory cell 105, the selection element 110 is put into a high resistance state.

However, when the voltage applied to the memory cell 105 reaches the threshold Th1, as shown in FIG. 4B, a defect is formed in the silicon-containing chalcogenide compound layer 108 of the selection element 110. This defect becomes a conductive path CP. Due to this, the resistance value of the selection element 110 is decreased as compared with the case of a high resistance state.

As shown in FIG. 4C, in the case where a voltage higher than the threshold Th1 is applied, a conductive path CP is formed in the silicon-containing chalcogenide compound layer 108, whereby a current density in the electrode 106 is increased. Due to this, a large Joule heat is applied to a portion HS including at least the silicon-containing chalcogenide compound layer 108, and the portion is heated. At this time, the heated silicon-containing chalcogenide compound layer 108 changes its crystal state by a phase transition. Further, since the temperature is high, a carrier concentration is increased. Due to this, the silicon-containing chalcogenide compound layer 108 is put into a low resistance state. Further, the heated silicon-containing chalcogenide compound layer 108 is put into a state where the atomic fluidity is high, and thus, by thermal crystal repair, the conductive path CP, that is, the defect is repaired. Thereafter, when the application of a voltage is stopped, the temperature of the silicon-containing chalcogenide compound layer 108 is decreased so as to have a crystal structure in a low-temperature phase, and therefore, the silicon-containing chalcogenide compound layer 108 is put into a high resistance state.

That is, the silicon-containing chalcogenide compound layer 108 is a layer in which the resistance state is changed according to the height of the voltage to be applied, and the change in the resistance state is not maintained after application of the voltage.

When the content of tellurium is about 60% or more and less than 100%, the melting point is relatively low, and the crystal phase undergoes a phase transition within a range from 410° C. to 886° C. At this time, a resistivity of silicon-tellurium is low, and atom transfer easily occurs. That is, in the case where the silicon-containing chalcogenide compound layer 108 is formed from silicon-tellurium, when the content of tellurium is 60% or more and less than about 100% and the temperature is 410° C. or higher and 886° C. or lower, the silicon-containing chalcogenide compound layer 108 is easily put into a low resistance state as shown in FIG. 4C, and therefore, the formed conductive path CP is easily repaired by the atom transfer.

Next, a current flowing manner in the memory device 100 according to the embodiment will be described.

Figure 5:
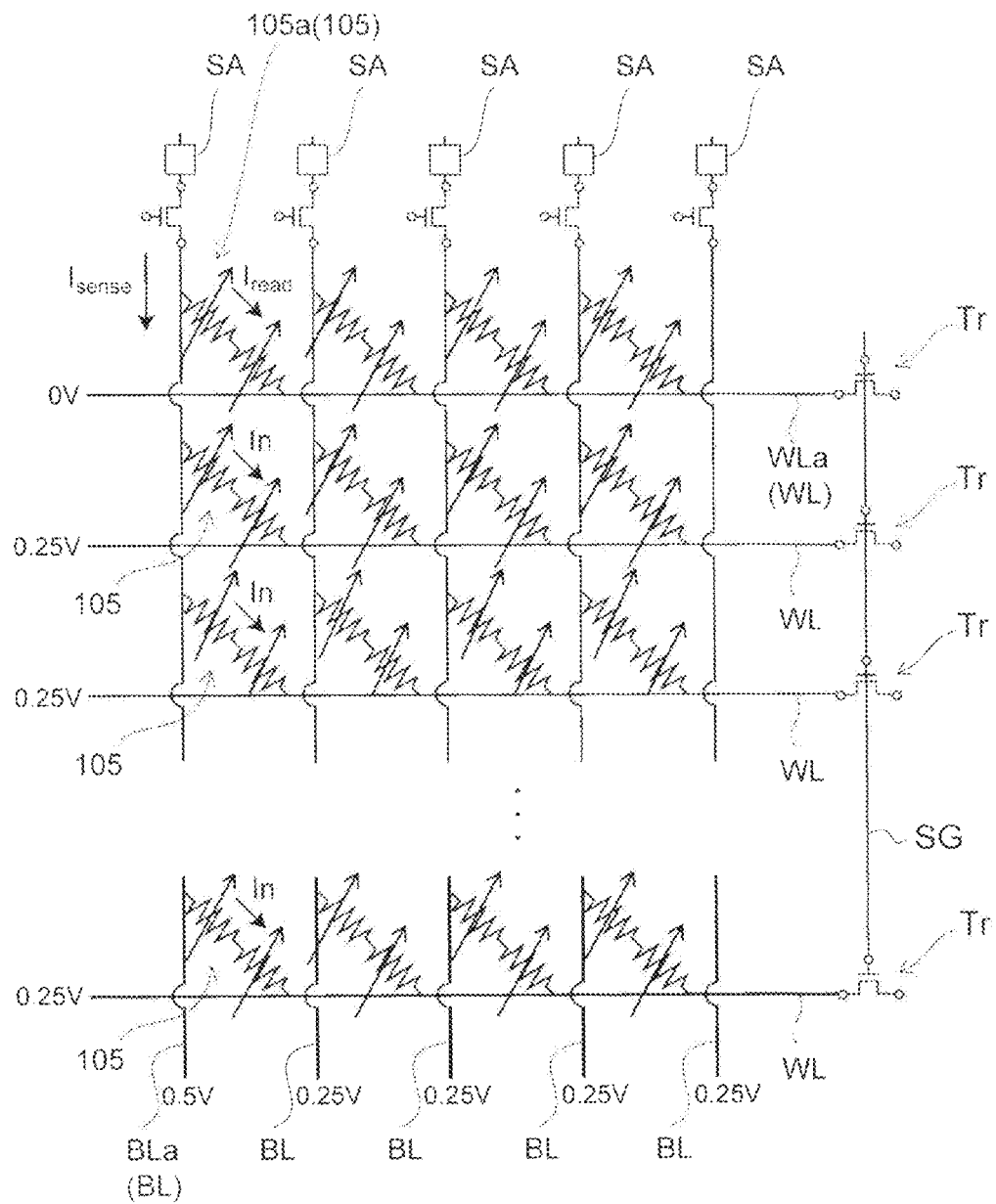
FIG. 5 is a circuit diagram illustrating the flow of a current in the memory device according to the first embodiment.

FIG. 5 is a circuit diagram illustrating the flow of a current in the memory device according to the embodiment.

As shown in FIG. 5, the memory cell 105 is connected to each intersecting part between each of the multiple bit lines BL and each of the multiple word lines WL. The respective bit lines BL are connected to sense amplifiers SA, respectively. Further, the word lines WL are connected to one selection gate electrode SG through the transistors Tr, respectively.

At this time, in the case where one memory cell 105a disposed at an intersecting part between a given bit line BLa and a given word line WLa is selected, and information is read, for example, a potential of 0.5 V is applied to the bit line BLa, and a potential lower than the potential applied to the bit line BLa, for example, a potential of 0.25 V is applied to the bit lines BL excluding the bit line BLa. At this time, the potential applied to the bit line BLa is defined as a read potential Vb, and the potential applied to the bit lines BL excluding the bit line BLa is defined as a half select potential (½)Vb. Further, also to the word lines WL excluding the word line WLa, the half select potential (½) Vb is applied. Further, to the word line WLa, 0 V is applied. According to this, to the memory cell 105a, a voltage of 0.5 V is applied, and a current flows therethrough. At this time, the voltage applied to the memory cell 105a is defined as a read voltage Vread. Further, since a potential difference is generated between the bit line BLa and the word lines WL, a current flows also through the memory cells 105 connected to the bit line BLa other than the memory cell 105a. At this time, the voltage applied to the memory cells 105 is defined as a half select voltage (½) Vread. Further, the current flowing through the bit line BLa is defined as a current Isense, the current flowing through the memory cell 105a is defined as a current Iread, and the current flowing through one memory cell 105 other than the memory cell 105a connected to the bit line BLa is defined as In. Further, the current flowing through all the memory cells 105 other than the memory cell 105a among the memory cells 105 connected to the bit line BLa, in other words, the sum of In is defined as Inoise. At this time, the sum of the current value of the current Iread and the current value of the noise current Inoise is substantially equal to the current value of the current Isense.

The noise current Inoise flowing through the memory cells 105 other than selected memory cell 105a becomes a noise when information is read from the given memory cell 105a. In general, in a cross-point structure shown in FIG. 5, the current value of the noise current Inoise is increased in proportion to the number of elements connected to the same bit line BL. That is, the noise level when reading is increased.

Incidentally, in the above description, the read potential Vb is set to 0.5 V, and the half select potential (½)Vb is set to 0.25 V, however, the values of the potentials to be applied to the bit lines BL are not limited thereto.

Next, a waveform of a pulse voltage to be applied to the memory cell 105 and a behavior of the memory cell 105 when a pulse voltage is applied will be described.

Figure 6A:
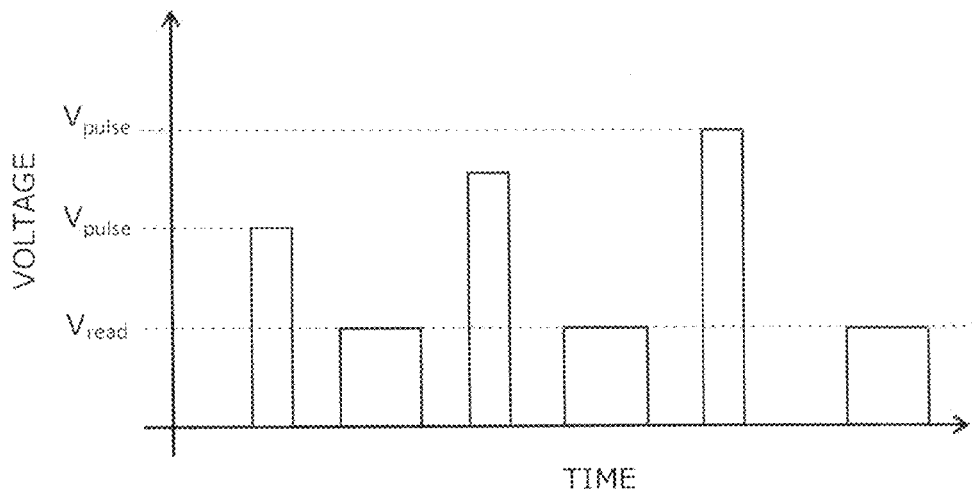
FIGS. 6A and 6B are graph showing a waveform of a pulse voltage to be applied to the memory device, where a horizontal axis is a voltage value, and a vertical axis is time.
Figure 6B:
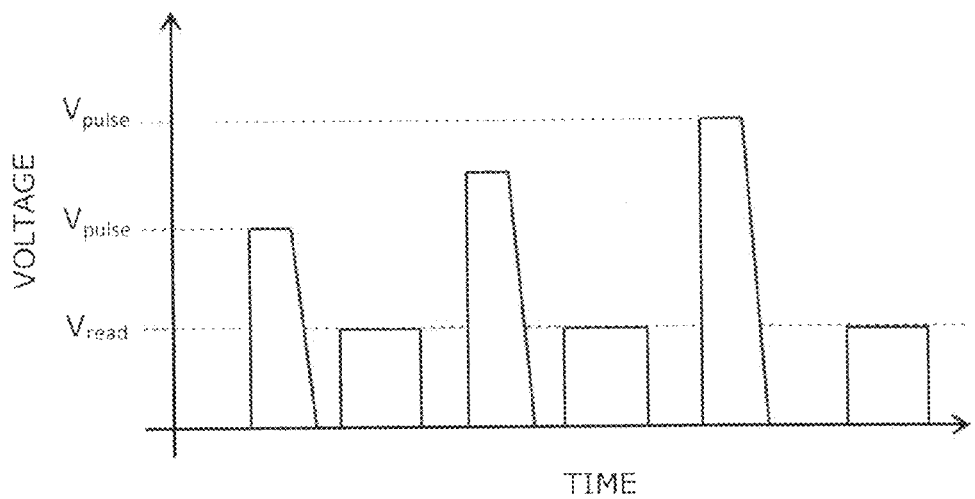

FIG. 6A is a graph illustrating waveforms of a pulse voltage and a (verify) read voltage to be applied to the memory cells 105 in a reset mode. FIG. 6B is a graph illustrating waveforms of a pulse voltage and a (verify) read voltage to be applied to the memory cells 105 in a set mode. FIGS. 6A and 6B illustrate three loops of the pulse voltage and the (verify) read voltage, respectively.

FIGS. 7A, 7D, and 7G are graphs illustrating a relationship between a voltage value and a current value when a pulse voltage is applied. FIGS. 7B, 7E, and 7H are graphs illustrating a relationship between a pulse voltage value and a resistance value when a read voltage is applied after a pulse voltage is applied. FIGS. 7C, 7F, and 7I are graphs illustrating a relationship between a pulse voltage value and a resistance when a voltage corresponding to one half of a read voltage (a half select voltage) is applied after a pulse voltage is applied. Incidentally, the voltage value of the pulse voltage is represented by "Vpulse" in FIGS. 6A and 6B, and the voltage value of the read voltage Vread is represented by "Vread" in the drawings.

As illustrated in FIG. 6A, a fall of a waveform of a pulse voltage in a reset mode is relatively steep, and in this embodiment, this waveform is called "rectangular wave". As illustrated in FIG. 6B, a fall of a waveform of a pulse voltage in a set mode is relatively gradual, and in this embodiment, this waveform is called "trapezoidal wave". That is, a fall of a waveform (trapezoidal wave) of a pulse voltage to be applied in a set mode is more gradual than that of a waveform (rectangular wave) of a pulse voltage to be applied in a reset mode. A falling time of a pulse voltage (trapezoidal wave) in a set mode is preferably, for example, 100 nsec or more. A falling time of a pulse voltage (rectangular wave) in a reset mode is shorter than that of a pulse voltage in a set mode, and is preferably, for example, 50 nsec or less.

In the case where a rectangular wave pulse voltage shown in FIG. 6A is applied to the resistance change film 111, after application of the voltage, the generation amount of Joule heat generated in the resistance change film 111 is rapidly decreased.

On the other hand, in the case where a trapezoidal wave pulse voltage shown in FIG. 6B is applied to the resistance change film 111, since a fall of the voltage is more gradual than that of the pulse voltage shown in FIG. 6A, also the generation amount of Joule heat generated in the resistance change film 111 is gradually decreased accordingly.

That is, a Joule heat generation amount drop speed in the resistance change film 111 is different between a case where a pulse voltage shown in FIG. 6A is applied to the resistance change film 111 and a case where a pulse voltage shown in FIG. 6B is applied to the resistance change film 111. Due to a difference in the Joule heat generation amount drop speed in this manner, a difference in a speed until the resistance change film 111 heated to a given temperature is cooled occurs. Such a difference in the cooling speed after application of a pulse voltage of the resistance change film 111 brings about a difference in a crystal state.

When a rectangular wave pulse voltage as shown in FIG. 6A is applied to the resistance change film 111 in a low resistance state at a given threshold voltage or higher, the resistance change film 111 changes from a crystal structure in a low resistance state to a crystal structure in a high resistance state. That is, the pulse voltage shown in FIG. 6A is a pulse voltage capable of changing the resistance change film 111 from a set state to a reset state.

Further, when a trapezoidal wave pulse voltage with a gradual fall as shown in FIG. 6B is applied to the resistance change film 111 in a high resistance state at a given threshold voltage or higher, the resistance change film 111 changes from a crystal structure in a high resistance state to a crystal structure in a low resistance state. That is, the pulse voltage shown in FIG. 6B is a pulse voltage capable of changing the resistance change film 111 from a reset state to a set state.

As shown in FIGS. 6A and 6B, to the memory cell 105, a read voltage Vread is applied after a pulse voltage is applied. The read voltage Vread is a rectangular wave.

Next, a case where a pulse voltage for changing a resistance state of the memory cell is applied to the memory device 100 according to the first embodiment will be described.

The broken line charts shown in FIGS. 7A to 7C and 7G to 7H are data in the case where a rectangular pulse voltage shown in FIG. 6A is applied, and solid line charts shown therein are data in the case where a trapezoidal pulse voltage shown in FIG. 6B is applied.

FIGS. 7A to 7C show cases where a pulse voltage is applied to the resistance change film.

As shown in FIG. 7A, when a rectangular wave pulse voltage shown in FIG. 6A is applied to the resistance change film 111 in a low resistance state, that is, in a set state, a pulse current flows in proportion to the height of the voltage value of the pulse voltage. Further, in the case where a trapezoidal wave pulse voltage shown in FIG. 6B is applied to the resistance change film 111 in a high resistance state, that is, in a reset state, almost no current flows at a voltage value lower than a threshold Th2, however, a current suddenly begins to flow at a voltage value of the threshold Th2, and at a voltage value higher than the threshold Th2, a current flows in proportion to the height of the voltage value of the pulse voltage.

At this time, as shown by the arrows in FIG. 7A, when a rectangular wave read voltage Vread is applied to the resistance change film 111 in a low resistance state, a current flows therethrough. Further, also in the case where a half select voltage (½) Vread is applied, a current lower than in the case where a voltage value of the read voltage Vread is applied flows therethrough.

Further, as shown in FIG. 7B, in the case where a read voltage Vread is applied to the resistance change film 111 in a low resistance state after a rectangular wave pulse voltage having a voltage value lower than the threshold Th2 is applied, the resistance change film 111 remains in a low resistance state. On the other hand, in the case where a rectangular wave pulse voltage having a voltage value of the threshold Th2 or higher is applied to the resistance change film 111, the resistance change film 111 is put into a high resistance state. That is, in the case where a rectangular wave pulse voltage is applied at a voltage value of the threshold Th2 or higher, the resistance change film 111 changes from a low resistance state to a high resistance state, and the resistance state is maintained.

Further, in the case where a read voltage Vread is applied to the resistance change film 111 in a high resistance state after a trapezoidal wave pulse voltage having a voltage value lower than the threshold Th2 is applied, the resistance change film 111 remains in a high resistance state. On the other hand, in the case where a trapezoidal wave pulse voltage having a voltage value of the threshold Th2 or higher is applied to the resistance change film 111, the resistance change film 111 is put into a low resistance state. That is, in the case where a trapezoidal wave pulse voltage is applied at a voltage value of the threshold Th2 or higher, the resistance change film 111 changes from a high resistance state to a low resistance state, and the resistance state is maintained. Further, as shown in FIG. 7C, also in the case where a half select voltage (½) Vread is applied after the pulse voltage is applied, a change in the resistance state of the resistance change film 111 can be read in the same manner as the case where the read voltage Vread is applied.

FIGS. 7D to 7F show cases where a pulse voltage is applied to a selection element.

As shown in FIG. 7D, in the case where a pulse voltage lower than a given threshold Th1 is applied to the selection element 110, almost no current flows. In the case where a pulse voltage having a voltage value of the threshold Th1 is applied, a current suddenly begins to flow. In the case where a pulse voltage higher than the threshold Th1 is applied, a current flows in proportion to the voltage value of the pulse voltage. At this time, the threshold Th1 is lower than the read voltage Vread and higher than the half select voltage (½) Vread.

Further, as shown in FIG. 7E, when a read voltage Vread is applied after a pulse voltage is applied, a resistance value shows a substantially constant low value regardless of the voltage value of the pulse voltage. That is, the selection element 110 is in a low resistance state.

Further, as shown in FIG. 7F, a resistance value when a half select voltage (½) Vread is applied to the selection element 110 after a pulse voltage is applied shows a substantially constant high value regardless of the voltage value of the applied pulse voltage. That is, the selection element 110 is put into a high resistance state when the half select voltage (½) Vread is applied.

Incidentally, in the memory device 100 according to the embodiment, the resistance value of the selection element 110 can be controlled by changing the layer thickness of the silicon-containing chalcogenide compound layer 108. Further, a difference in the waveform of the pulse voltage hardly contributes to a change in the resistance state of the selection element 110. That is, the selection element 110 changes its resistance state according to the height of the applied voltage, and the change in the resistance state is not maintained after application of the voltage.

FIGS. 7G to 7I show cases where a pulse voltage is applied to a memory cell.

As shown in FIG. 7G, in the case where a rectangular wave pulse voltage lower than the threshold Th1 is applied to the memory device 100 in which the resistance change film 111 is in a low resistance state, almost no current flows through the memory cell 105. Further, in the case where a pulse voltage of the threshold Th1 is applied, a current suddenly begins to flow. Further, in the case where a pulse voltage of the threshold Th1 or higher is applied, a current flows in proportion to the height of the voltage value of the pulse voltage. Still further, in the case where a trapezoidal wave pulse voltage is applied, substantially the same results as the case shown in FIG. 7A are obtained.

Further, as shown in FIGS. 7H and 7I, the resistance value of the memory cell 105 results in a combined resistance of the resistance change film 111 and the selection element 110.

That is, even if a half select voltage (½) Vread is applied to the memory cell 105 in which the resistance change film 111 is in a low resistance state, since the resistance of the selection element 110 is high, almost no current flows through the memory cell 105. However, in the case where a read voltage Vread is applied, since the selection element 110 is put into a low resistance state, a current begins to flow through the memory cell 105.

Further, at this time, in the memory cell 105 in the embodiment, the resistance value of the selection element 110 in a low resistance state is preferably lower than the resistance value of the resistance change film 111 in a low resistance state by one digit or more. In the case where the resistance value of the selection element 110 in a low resistance state is lower than the resistance value of the resistance change film 111 in a low resistance state by one digit or more, the selection element 110 in a low resistance state hardly contributes as a resistance of the memory cell 105. In this case, when a read voltage Vread is applied, the selection element 110 hardly has an effect on the value of a current flowing through the memory cell 105.

Figure 8A:
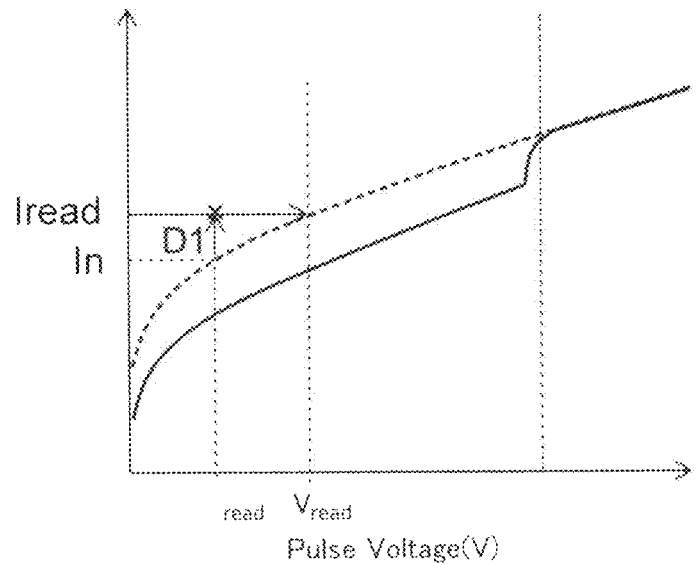
FIG. 8A is a graph illustrating a relationship between a voltage value and a current value when a pulse voltage is applied to the resistance change film.
Figure 8B:
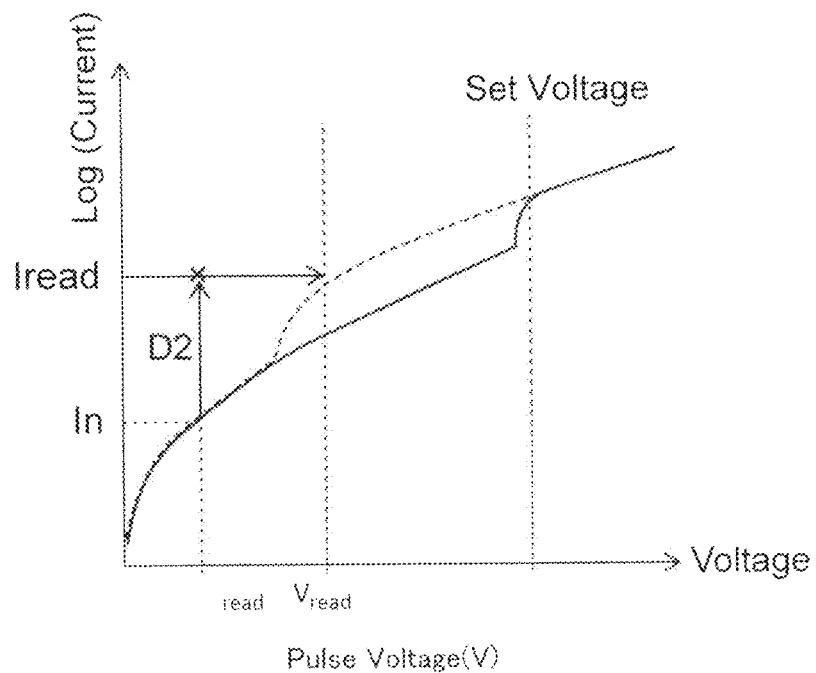
FIG. 8B is a graph illustrating a relationship between a voltage value and a current value when a pulse voltage is applied to the memory cell.

FIG. 8A is a graph illustrating a relationship between a voltage value and a current value when a pulse voltage is applied to the resistance change film. FIG. 8B is a graph illustrating a relationship between a voltage value and a current value when a pulse voltage is applied to the memory cell.

FIG. 8A is a graph in which the ordinate of the graph in FIG. 7A is expressed in a log scale. FIG. 8B is a graph in which the ordinate of the graph in FIG. 7G is expressed in a log scale.

In FIGS. 8A and 8B, when a difference between a current In when a half select voltage (½) Vread is applied and a current Iread when a read voltage Vread is applied is compared, a difference D2 in the case where a pulse voltage is applied to the memory cell 105 having the selection element 110 is larger than a difference D1 in the case where a pulse voltage is applied only to the resistance change film 111.

In a circuit in which multiple memory cells 105 are connected to the same bit line BL as shown in FIG. 5, a half select voltage (½) Vread is applied also to the memory cells 105 other than the memory cell 105a from which information is read. As a result, a current In flows through the memory cells 105 to which the half select voltage (½) Vread is applied. At this time, reading of the information is more stabilized as the difference between the current In and the current Iread is larger.

Next, an effect of the embodiment will be described.

In the memory device 100 according to the embodiment, the selection element 110 is connected in series to the resistance change film 111. The selection element 110 has a property in which it is put into a high resistance state when a voltage lower than the threshold Th1 is applied, and it is put into a low resistance state when a voltage of the threshold Th1 or higher is applied. In the embodiment, the threshold Th1 exists between the read voltage Vread and the half select voltage (½) Vread. According to this, in the case where the half select voltage (½) Vread is applied to the memory cell 105 in which the resistance change film 111 is in a low resistance state, since the resistance value of the selection element 110 is high, a current flowing through the memory cell 105 is restricted. Therefore, in the memory device 100, the current value of the noise current Inoise which is the sum of the current In is decreased.

In general, in a memory device having a resistance change film in which a film containing germanium-tellurium and a film containing antimony-tellurium are stacked on each other, the resistance value in a low resistance state is low, and therefore, there is a problem that in the case where multiple elements in a low resistance state are connected to the same bit line, a noise level is increased.

However, in the embodiment, since the selection element 110 is provided, a noise current Inoise flowing through the circuit can be suppressed. That is, in a circuit in which multiple memory cells 105 are connected to the same bit line as shown in FIG. 2, the noise level can be decreased.

Further, by providing the selection element 110, in the case where information is read from a given memory cell, the noise current Inoise flowing through the circuit is decreased. Therefore, a current amount for driving the memory device 100 is decreased. As a result, the power consumption of the memory device can be reduced.

First Variation of First Embodiment

Next, a first variation of the first embodiment will be described.

Figure 9:
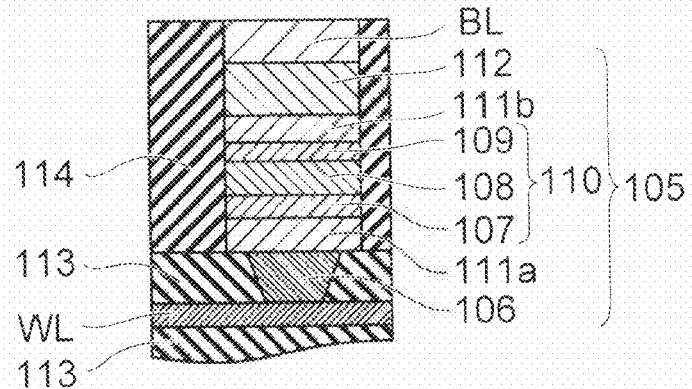
FIG. 9 is a cross-sectional view illustrating a memory cell of a memory device according to a first variation of the first embodiment.

FIG. 9 is a cross-sectional view illustrating a memory cell of a memory device according to the variation.

As shown in FIG. 9, in a memory cell 105 of the memory device according to the variation, a resistance change film 111a is provided on an electrode 106. On the resistance change film 111a, a selection element 110 is provided. On the selection element 110, a resistance change film 111b is provided. On the resistance change film 111b, an electrode 112 is provided. The electrode 106, the resistance change film 111a, the selection element 110, the resistance change film 111b, and the electrode 112 are connected in series to one another.

A word line WL and the electrode 106 are embedded in an insulating film 113, and the selection element 110, the resistance change film 111a, 111b, the electrode 112, and a bit line BL are embedded in an insulating film 114.

Other configurations and effects are the same as those of the memory device 100 according to the first embodiment.

Second Variation of First Embodiment

Next, a second variation of the first embodiment will be described.

Figure 10:
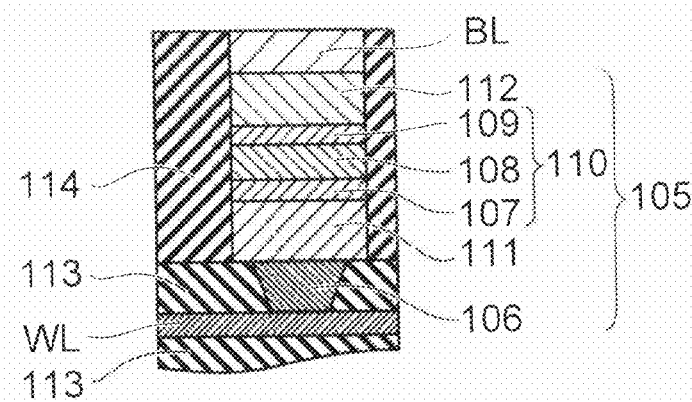
FIG. 10 is a cross-sectional view illustrating a memory cell of a memory device according to a second variation of the first embodiment.

FIG. 10 is a cross-sectional view illustrating a memory cell of a memory device according to the variation.

As shown in FIG. 10, in a memory cell 105 of the memory device according to the variation, a resistance change film 111 is provided on an electrode 106, and on the resistance change film 111, a selection element 110 is provided. On the selection element 110, an electrode 112 is provided. A word line WL and the electrode 106 are embedded in an insulating film 113, and the selection element 110, the resistance change film 111, and the electrode 112 are embedded in an insulating film 114.

Other configurations and effects are the same as those of the memory device 100 according to the first embodiment.

Third Variation of First Embodiment

Next, a third variation of the first embodiment will be described.

Figure 11:
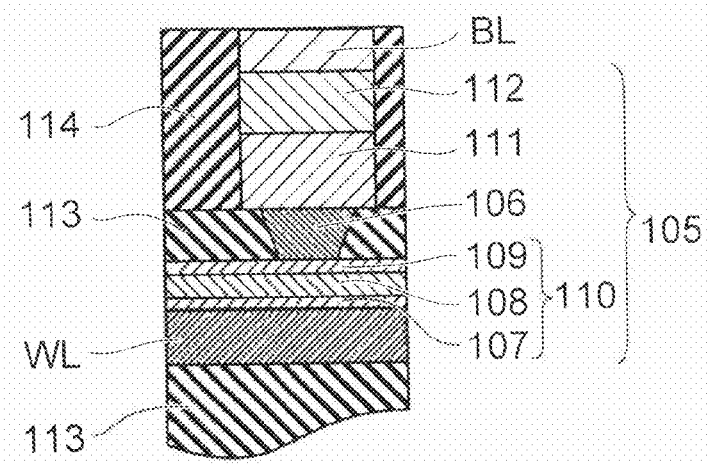
FIG. 11 is a cross-sectional view illustrating a memory cell of a memory device according to a third variation of the first embodiment.

FIG. 11 is a schematic view illustrating a cross section of a memory cell of a memory device according to the third variation of the first embodiment.

As shown in FIG. 11, in a memory cell 105 according to the variation, a selection element 110 is provided on a word line WL. The selection element 110 may be provided throughout the entire area on one word line WL or may be shared by another memory cell 105 provided on the word line WL. On the selection element 110, an electrode 106 is provided. On the electrode 106, a resistance change film 111 is provided. On the resistance change film 111, an electrode 112 is provided. The word line WL, the selection element 110, and the electrode 106 are embedded in an insulating film 113, and the resistance change film 111 and the electrode 112 are embedded in an insulating film 114.

Other configurations and effects are the same as those of the memory device 100 according to the first embodiment.

Fourth Variation of First Embodiment

Next, a fourth variation according to the first embodiment will be described.

Figure 12:
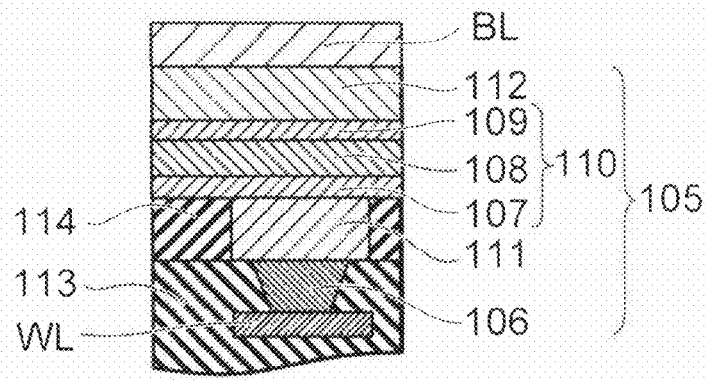
FIG. 12 is a cross-sectional view illustrating a memory cell of a memory device according to a fourth variation of the first embodiment.

FIG. 12 is a cross-sectional view illustrating a memory cell of a memory device according to the variation.

As shown in FIG. 12, in a memory cell 105 according to the variation, an electrode 106 is provided on a word line WL, and on the electrode 106, a resistance change film 111 is provided. On the resistance change film 111, a selection element 110 is provided. On the selection element 110, an electrode 112 is provided. The word line WL, the selection element 110, and the electrode 106 are embedded in an insulating film 113, and the resistance change film 111, the electrode 112, and a bit line BL are embedded in an insulating film 114.

Other configurations and effects are the same as those of the memory device 100 according to the first embodiment.

Second Embodiment

Next, a second embodiment will be described.

Figure 13:
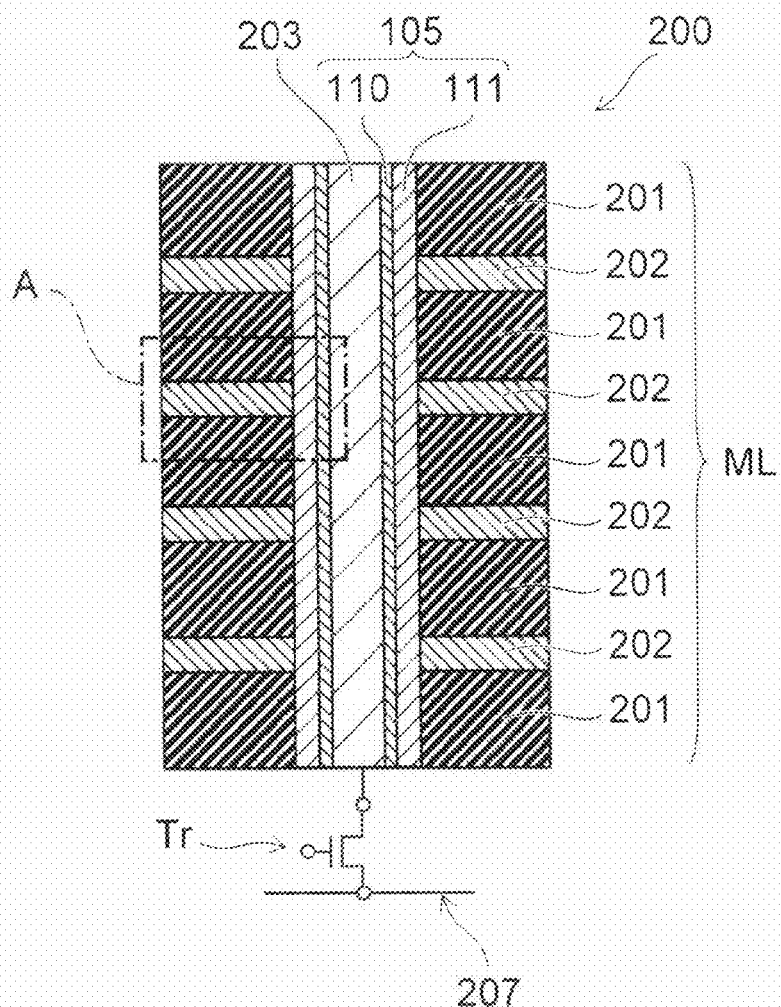
FIG. 13 is a cross-sectional view illustrating a memory device according to a second embodiment.

FIG. 13 is a cross-sectional view illustrating a memory device according to the embodiment.

Figure 14:
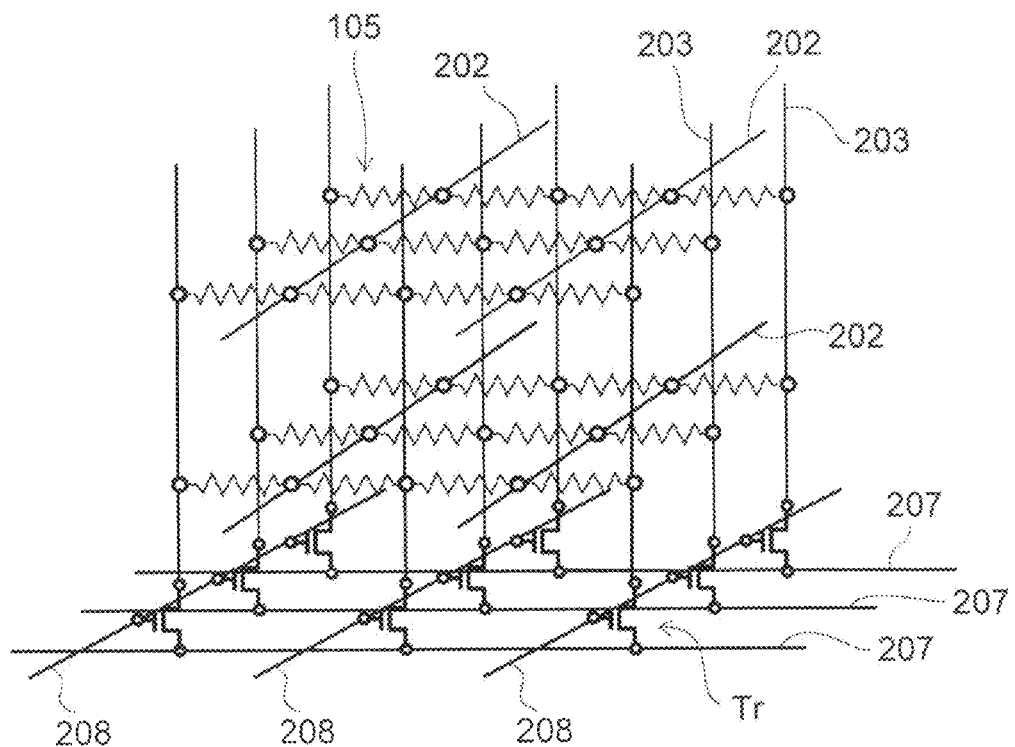
FIG. 14 is a circuit diagram of the memory device according to the second embodiment.

FIG. 14 is a circuit diagram of the memory device according to the embodiment.

As shown in FIGS. 13 and 14, a memory device 200 according to the embodiment is provided with a stacked body ML, which includes multiple insulating films 201 and multiple conductive films 202, and in which each of the multiple insulating films 201 and each of the multiple conductive films 202 are alternately stacked on each other. In the stacked body ML, a bit line 203 in an approximately cylindrical shape extending in a stacking direction of the stacked body ML is provided. Between the bit line 203 and the stacked body ML, a memory cell 105 is provided. The memory cell 105 is composed of a resistance change film 111 provided on a side surface of the stacked body ML and a selection element 110 provided between the resistance change film 111 and the bit line 203. The bit line 203 is connected to a lower word line 207 through a transistor Tr. Further, as shown in FIG. 14, the lower word line 207 is connected to a selection gate electrode 208.

Incidentally, in FIG. 13, one configuration unit of the memory device 200 according to the embodiment is shown, and as shown in the circuit diagram of FIG. 14, multiple configuration units may be connected to one another. Further, in FIG. 14, the memory cell is illustrated as one resistance element.

Next, the memory cell 105 of the memory device 200 according to the embodiment will be described.

Figure 15:
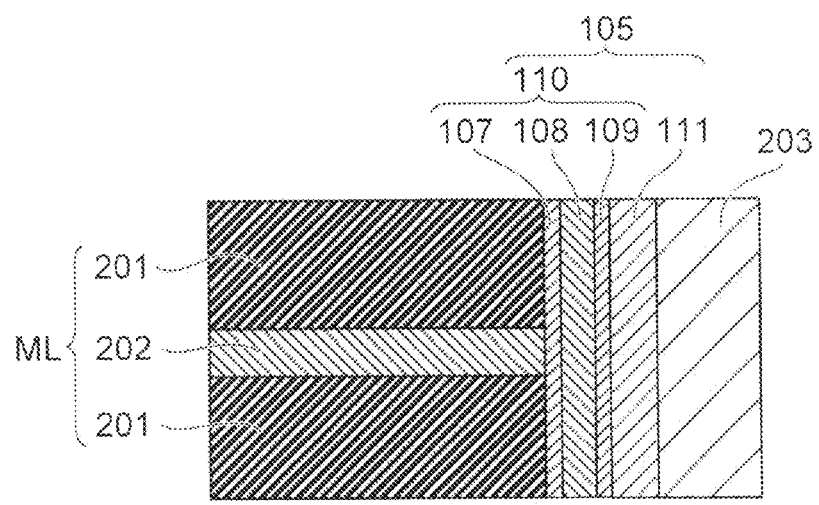
FIG. 15 is an enlarged view of a region A shown in FIG. 13 of the memory device according to the second embodiment.

FIG. 15 is an enlarged view of a region A shown in FIG. 13 of the memory device according to the embodiment.

As shown in FIG. 15, on a side surface of the stacked body ML, an antimony-tellurium layer 107, a silicon-containing chalcogenide compound layer 108, and an antimony-tellurium layer 109 are disposed in this order from the side surface side of the stacked body ML to form the selection element 110. Between the selection element 110 and the bit line BL, the resistance change film 111 is disposed.

The resistance change film 111 includes a superlattice portion having a superlattice structure. The resistance change film 111 is, for example, a stacked film in which a film containing germanium and tellurium and a film containing antimony and tellurium are alternately stacked on each other.

Incidentally, the antimony-tellurium layers 107 and 109 may be bismuth-tellurium layers. The silicon-containing chalcogenide compound layer 108 may contain silicon-tellurium. The silicon-containing chalcogenide compound layer 108 preferably has a composition in which silicon is contained in an amount of more than 0% and 40% or less, and tellurium is contained in an amount of 60% or more and less than 100%. Alternatively, the silicon-containing chalcogenide compound layer 108 may contain silicon-selenium or silicon-sulfur. The resistance change film 111 may be a film containing a metal oxide whose resistance value is changed by an external effect such as heating.

Next, an effect of the embodiment will be described.

In the memory cell 105 of the memory device 200 according to the embodiment, the selection element 110 and the resistance change film 111 are connected in series to each other. In the case where a half select voltage (½) Vread is applied to the memory cell 105, since the resistance value of the selection element 110 is high, a current In flowing through the memory cell 105 in which the resistance change film 111 is in a low resistance state can be suppressed. Accordingly, even in a memory device in which many memory cells 105 are three-dimensionally integrated, the noise level can be decreased.

Further, by providing the selection element 110, in the case where information is read from a given memory cell, the noise current Inoise flowing through the circuit is decreased. According to this, a current amount for driving the memory device 200 is decreased. As a result, the power consumption of the memory device can be reduced.

First Variation of Second Embodiment

Next, a first variation of the second embodiment will be described.

Figure 16:
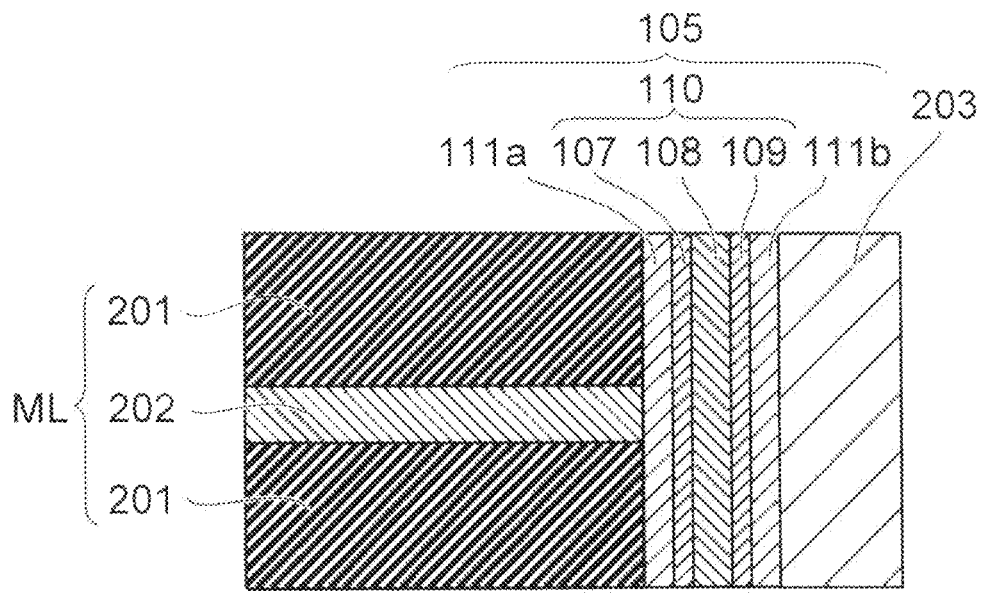
FIG. 16 is a cross-sectional view illustrating a memory device according to a first variation of the second embodiment and shows a region corresponding to the region A shown in FIG. 14.

FIG. 16 is a cross-sectional view illustrating a memory device according to the variation and shows a region corresponding to the region A shown in FIG. 13.

As shown in FIG. 16, in the memory device according to the variation, a resistance change film 111a is provided on a side surface of the stacked body ML. On a side surface of the resistance change film 111a, a selection element 110 is provided. Between the selection element 110 and a bit line 203, a resistance change film 111b is provided. The selection element 110 is composed of an antimony-tellurium layer 107, a silicon-containing chalcogenide compound layer 108, and an antimony-tellurium layer 109, which are disposed in this order from the side surface side of the resistance change film 111a.

Other configurations and effects are the same as those of the second embodiment.

Second Variation of Second Embodiment

Next, a second variation of the second embodiment will be described.

Figure 17:
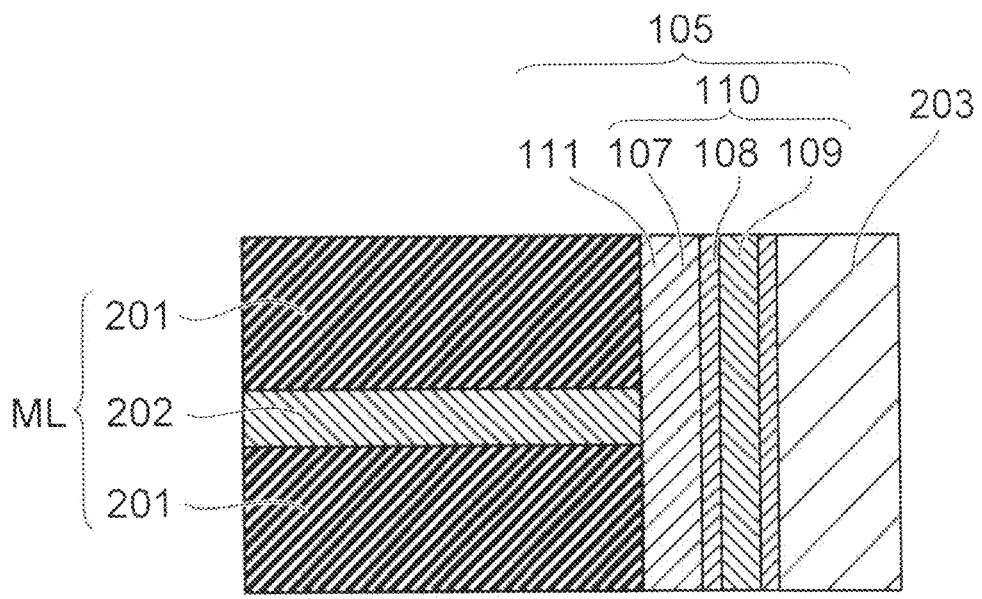
FIG. 17 is a cross-sectional view illustrating a memory device according to the second variation of the second embodiment and shows a region corresponding to the region A shown in FIG. 13.

FIG. 17 is a cross-sectional view illustrating a memory device according to the variation and shows a region corresponding to the region A shown in FIG. 13.

As shown in FIG. 17, in the memory device according to the variation, a resistance change film 111 is disposed on a side surface of a stacked body ML, and between the resistance change film 111 and a bit line 203, a selection element 110 is disposed. According to this, a memory cell 105 is formed from the resistance change film 111 and the selection element 110. The selection element 110 is composed of an antimony-tellurium layer 107, a silicon-containing chalcogenide compound layer 108, and an antimony-tellurium layer 109, which are disposed in this order from the side surface side of the resistance change film 111.

Other configurations and effects are the same as those of the second embodiment.

According to the embodiments described above, a memory device exhibiting high reading stability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
    a resistance change film;
    a selection element connected with the resistance change film in series; and
    an electrode connected with at least one of the resistance change film and the selection element,
    the selection element containing a chalcogenide compound,
    the chalcogenide compound containing silicon.

2. The device according to claim 1, wherein the chalcogenide compound contains silicon-tellurium.

3. The device according to claim 1, wherein a composition ratio of silicon in the chalcogenide compound is more than 0% and 40% or less, and
    a composition ratio of tellurium in the chalcogenide compound is 60% or more and less than 100%.

4. The device according to claim 1, wherein the resistance change film includes a superlattice structure.

5. The device according to claim 4, wherein in the superlattice structure, a first film containing germanium and tellurium and a second film containing antimony and tellurium are stacked on each other.

6. The device according to claim 1, wherein a fall of a first waveform of a first pulse voltage to be applied to the selection element at a setting is more gradual than a fall of a second waveform of a second pulse voltage to be applied to the selection element at a resetting.

7. A memory device, comprising:
    a semiconductor substrate;
    a plurality of first wirings provided on the semiconductor substrate and extending in a first direction;
    a plurality of second wirings provided on the first wirings and extending in a second direction crossing the first direction;
    a plurality of resistance change films, one of the resistance change films being disposed between one of the first wirings and one of the second wirings; and
    a selection element connected with one of the resistance change films in series,
    the selection element containing a chalcogenide compound,
    the chalcogenide compound containing silicon.

8. The device according to claim 7, wherein the chalcogenide compound contains silicon-tellurium.

9. The device according to claim 7, wherein a composition ratio of silicon in the chalcogenide compound is more than 0% and 40% or less, and
    a composition ratio of tellurium in the chalcogenide compound is 60% or more and less than 100%.

10. The device according to claim 7, wherein the resistance change film includes a superlattice structure.

11. The device according to claim 10, wherein in the superlattice structure, a first film containing germanium and tellurium and a second film containing antimony and tellurium are stacked on each other.

12. The device according to claim 7, wherein a first fall of a first waveform of a first pulse voltage to be applied to the selection element at a setting is more gradual than a second fall of a second waveform of a second pulse voltage to be applied to the selection element at a resetting.

13. A memory device, comprising:
    a stacked body including a plurality of electrode films and a plurality of insulating films alternately arranged with electrode films in a first direction;
    a wiring provided in the stacked body and extending in the first direction;
    a resistance change film which is provided between the wiring and the stacked body; and
    a selection element provided between the wiring and the stacked body and connected with the resistance change film in series, and
    the selection element containing a chalcogenide compound,
    the chalcogenide compound containing silicon.

14. The device according to claim 13, wherein the selection element contains silicon-tellurium.

15. The device according to claim 13, wherein a composition ratio of silicon in the chalcogenide compound is more than 0% and 40% or less, and
    a composition ratio of tellurium in the chalcogenide compound is 60% or more and less than 100%.

16. The device according to claim 13, wherein the resistance change film includes a superlattice structure.

17. The device according to claim 16, wherein in the superlattice structure, a first film containing germanium and tellurium and a second film containing antimony and tellurium are alternately stacked on each other.

18. The device according to claim 17, wherein a fall of a first waveform of a first pulse voltage to be applied at the selection element at a setting time is more gradual than that a fall of a second waveform of a second pulse voltage to be applied to the selection element at a resetting.

* * * * *